(12) United States Patent
McClure

(10) Patent No.: US 7,233,038 B2
(45) Date of Patent: Jun. 19, 2007

(54) SELF MASKING CONTACT USING AN ANGLED IMPLANT

(75) Inventor: Brent A. McClure, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 11/071,225

(22) Filed: Mar. 4, 2005

(65) Prior Publication Data

US 2005/0189573 A1    Sep. 1, 2005

Related U.S. Application Data

(62) Division of application No. 10/786,299, filed on Feb. 26, 2004, now Pat. No. 7,037,764.

(51) Int. Cl.
*H01L 31/062* (2006.01)
*H01L 31/113* (2006.01)

(52) U.S. Cl. ............... 257/292; 257/288; 257/E21.053; 257/E21.056; 257/E21.189; 257/E27.133

(58) Field of Classification Search ............... 257/292, 257/288, 213, 192, 291, 293, 490, 544, 27
See application file for complete search history.

(56) References Cited

U.S. PATENT DOCUMENTS

| | | | |
|---|---|---|---|
| 5,757,045 A | * | 5/1998 | Tsai et al. .................... 257/336 |
| 6,023,081 A | * | 2/2000 | Drowley et al. ............. 257/292 |
| 6,140,630 A | | 10/2000 | Rhodes |
| 6,184,055 B1 | * | 2/2001 | Yang et al. .................... 438/57 |
| 6,204,524 B1 | | 3/2001 | Rhodes |
| 6,218,691 B1 | * | 4/2001 | Chung et al. ................ 257/290 |
| 6,303,492 B1 | | 10/2001 | Rhodes |
| 6,310,366 B1 | | 10/2001 | Rhodes et al. |
| 6,326,652 B1 | * | 12/2001 | Rhodes ........................ 257/231 |
| 6,333,205 B1 | * | 12/2001 | Rhodes ........................ 438/69 |
| 6,376,868 B1 | | 4/2002 | Rhodes |
| 6,900,484 B2 | | 5/2005 | Rhodes |

* cited by examiner

*Primary Examiner*—David Nhu
(74) *Attorney, Agent, or Firm*—Dickstein Shapiro LLP

(57) ABSTRACT

A method of implanting, for example, a phosphorous plug over a charge collection region and a method of forming a contact over the phosphorous plug implant and charge collection region. The method allows implantation of phosphorous or other materials without contamination of other contact regions. The method further allows implantation of a material with only one step and without an extra masking step.

20 Claims, 14 Drawing Sheets

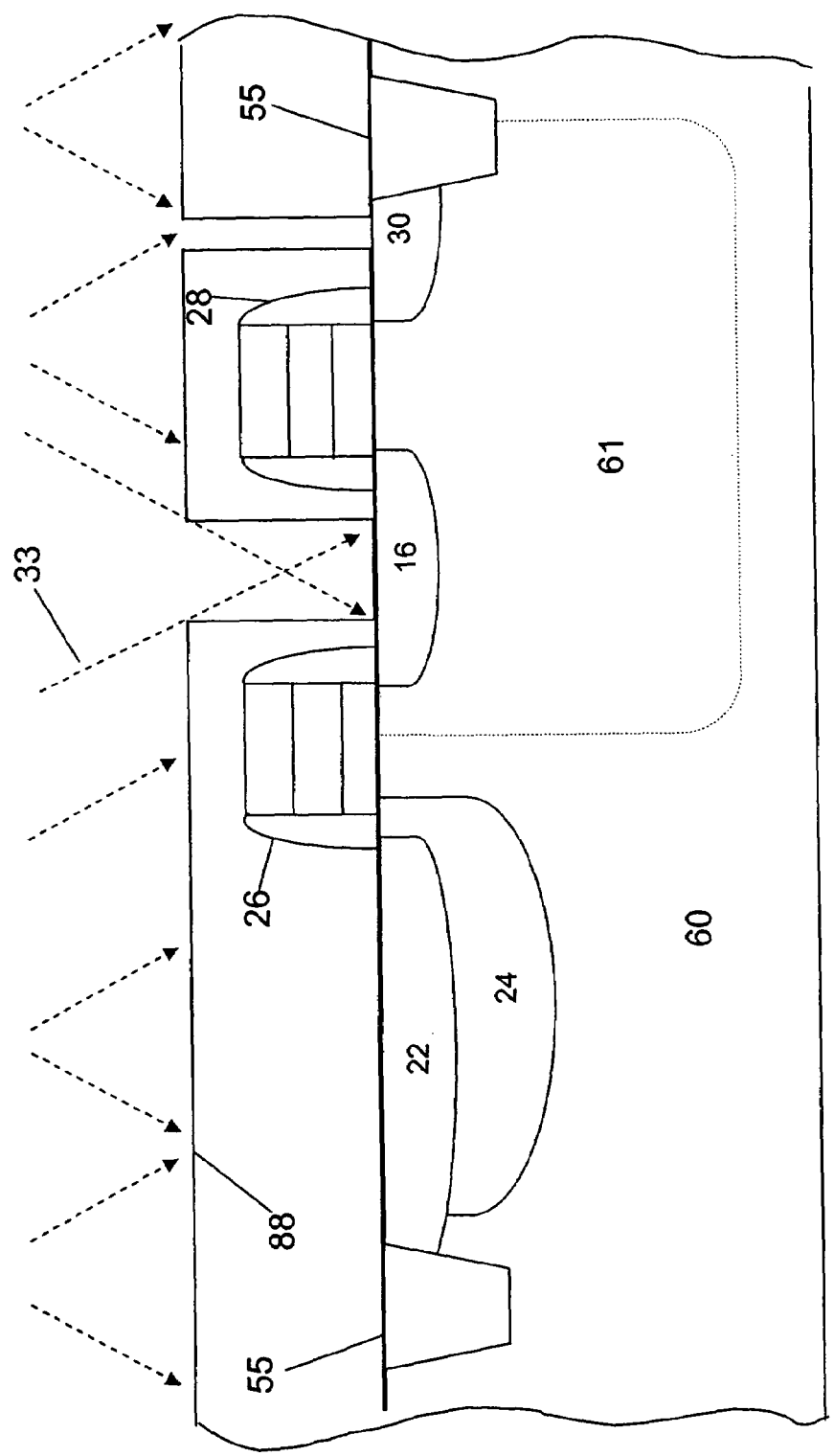

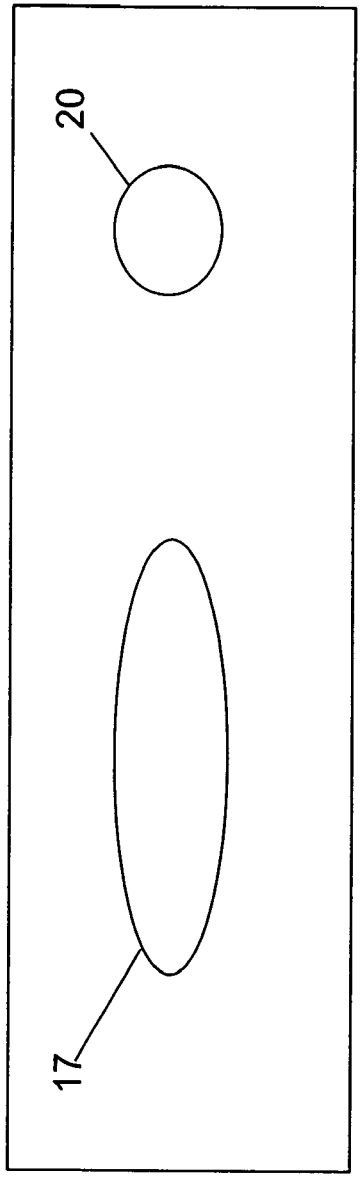
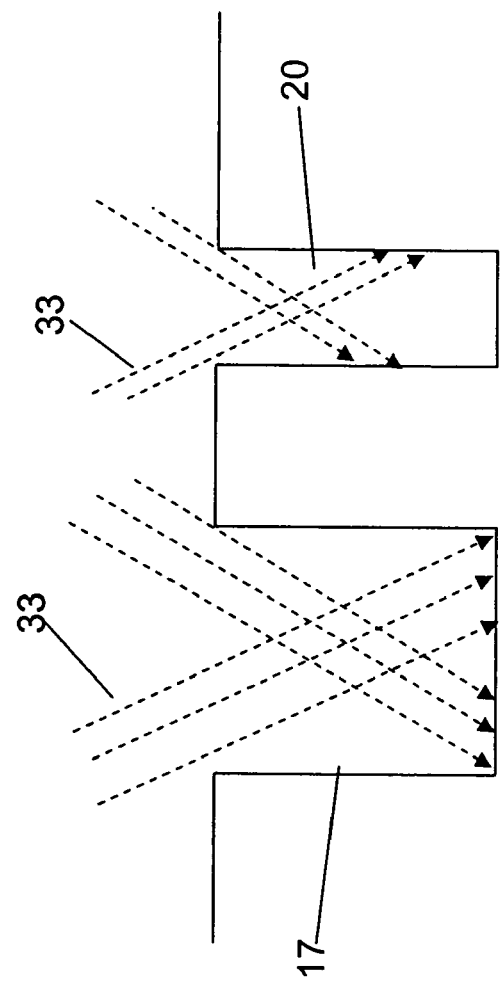
FIG. 11a
FIG. 11b

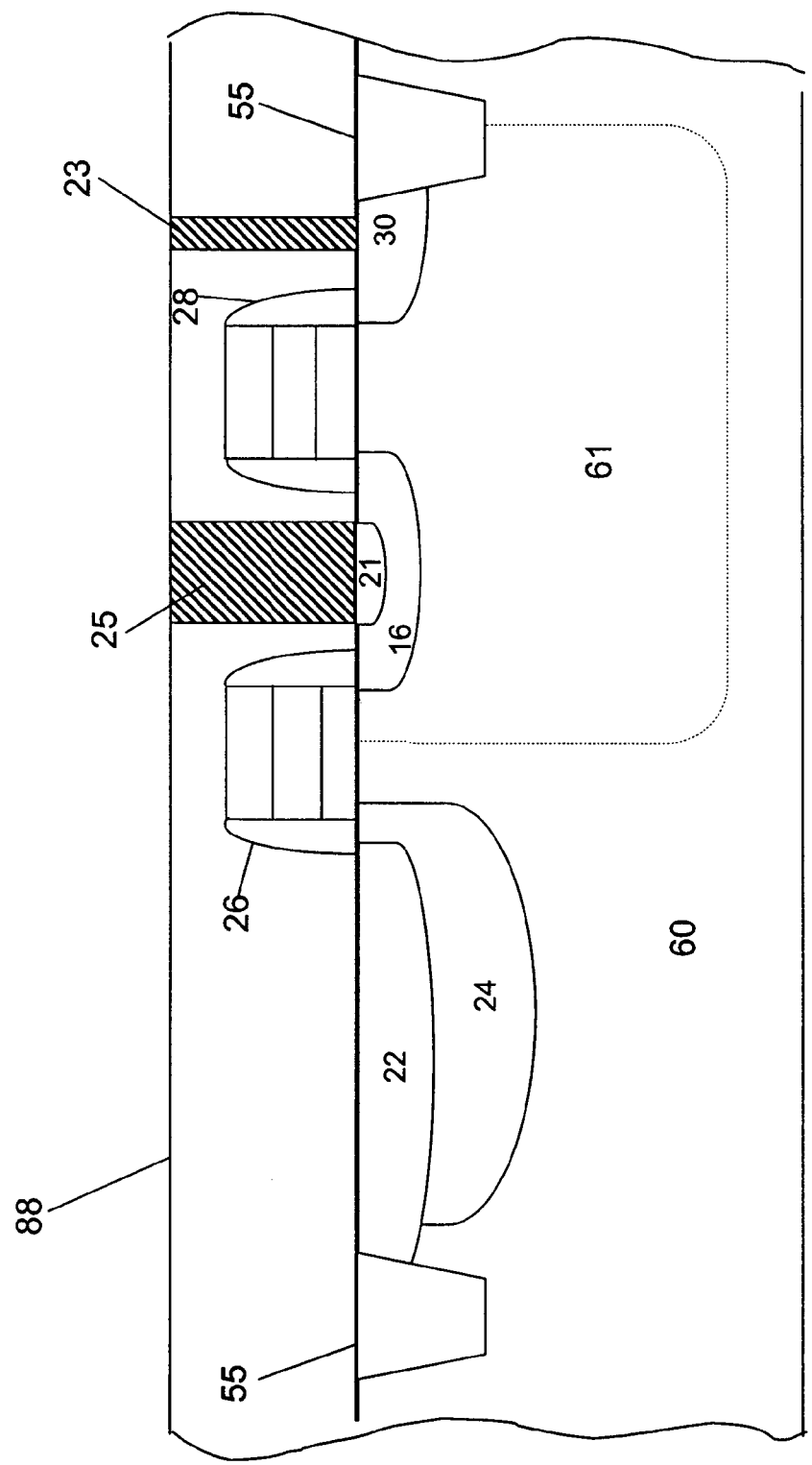

US 7,233,038 B2

SELF MASKING CONTACT USING AN ANGLED IMPLANT

The present application is a divisional of application Ser. No. 10/786,299, filed Feb. 26, 2004 now U.S. Pat. No. 7,037,764, the entire disclosure of which is incorporated herein by reference.

FIELD OF THE INVENTION

The invention relates generally to methods of forming an imager device.

BACKGROUND

Typically, a digital imager array includes a focal plane array of pixel cells, each one of the cells including a photoconversion device such as, e.g., a photogate, photoconductor, or a photodiode. In a complementary metal oxide semiconductor (CMOS) imager a readout circuit is connected to each pixel cell which typically includes a source follower output transistor. The photoconversion device converts photons to electrons which are typically transferred to a floating diffusion region connected to the gate of the source follower output transistor. A charge transfer device (e.g., transistor) can be included for transferring charge from the photoconversion device to the floating diffusion region. In addition, such imager cells typically have a transistor for resetting the floating diffusion region to a predetermined charge level prior to charge transference. The output of the source follower transistor is a voltage output on a column line when a row select transistor for the row containing the pixel is activated.

Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, and 6,333,205, assigned to Micron Technology, Inc. The disclosures of each of the forgoing patents are herein incorporated by reference in their entirety.

In a digital CMOS imager, when incident light strikes the surface of a photodiode, electron/hole pairs are generated in the p-n junction of the photodiode. The generated electrons are collected in the n-type region of the photodiode. The photo charge moves from the initial charge accumulation region to a charge collection region, typically a floating diffusion region, or it may be transferred to the floating diffusion region via a transfer transistor. The charge at the floating diffusion region is typically converted to a pixel output voltage by a source follower transistor.

The floating diffusion region of a CMOS imager is typically connected to metal runners by a contact photoresist/etch process that results in a metal to silicon Schottky diode contact. Some processes use a phosphorous plug implant just prior to contact metallization to reduce resistance and improve operation of the Schottky diode. This phosphorous implant can have a detrimental effect during processing of pixels, for example, when forming p-channel transistors phosphorous contamination can counter dope the p+ source and drain regions. The p+ source and drain regions and the more heavily doped conventional phosphorous ohmic contacts are typically formed during the same photoresist/etch step as the phosphorous plug. A method is needed to target implantation of dopants to minimize contamination of adjacent source/drain regions or other components of the pixel.

SUMMARY

The present invention provides a self-masking method of angled implantation, for implanting, for example, a phosphorous plug in a charge collection region and forming a contact over the phosphorous plug and charge collection region in an imager. The method allows implantation of phosphorous or other materials without contamination of other contact regions. The method further allows implantation of a material with only one step and without an extra masking step.

DESCRIPTION OF THE DRAWINGS

The above and other features and advantages of the invention will be more readily understood from the following detailed description which is provided in connection with the accompanying drawings, in which:

FIG. 10 shows a stage of processing subsequent to that shown in FIG. 9;

FIGS. 11a and 11b show views of the stage of processing shown in FIG. 10;

FIG. 12 shows a stage of processing subsequent to that shown in FIG. 10;

DETAILED DESCRIPTION OF THE INVENTION

In the following detailed description, reference is made to the accompanying drawings, which form a part hereof and show by way of illustration specific exemplary embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device and associated transistors for converting photons to an electrical signal. The pixels discussed herein are illustrated and described as inventive modifications to four transistor (4T) pixel circuits for the sake of example only. It should be understood that the invention may be used with other pixel arrangements having fewer (e.g., 3T) or more (e.g., 5T) than four transistors. Although the invention is described herein with reference to the architecture and fabrication of one pixel, it should be understood that this is representative of a plurality of pixels in an array of an imager device. In addition, although the invention is described below with reference to a CMOS imager, the invention has applicability to any solid state imaging device having pixels. The following detailed description is, therefore, not to be taken in a limiting sense.

Figure 1:
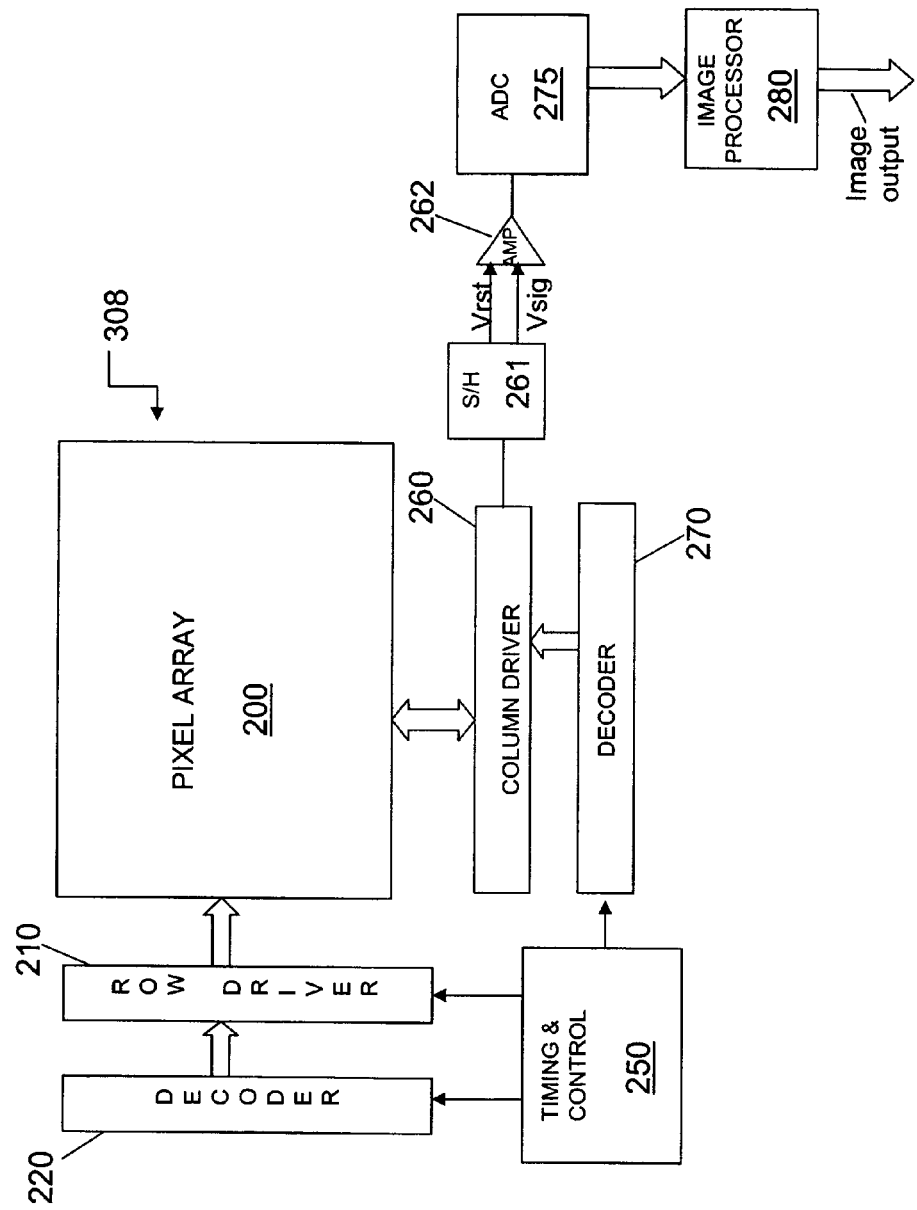
FIG. 1 is a block diagram of a CMOS imager chip having a pixel array with pixels according to the invention.

Now referring to the figures, where like reference numbers designate like elements, FIG. 1 illustrates a block diagram of an exemplary CMOS imager device 308 having a pixel array 200 with each pixel cell being constructed in accordance with an embodiment of the invention described below with reference to FIGS. 2, 13 or 14. Pixel array 200 comprises a plurality of pixels arranged in a predetermined number of columns and rows (not shown). The pixels of each row in array 200 are all turned on at the same time by a row select line, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel.

The CMOS imager of FIG. 1 is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$), are read by a sample and hold circuit 261 associated with the column device 260. A differential signal ($V_{rst}$-$V_{sig}$) is produced by differential amplifier 262 for each pixel which is digitized by analog to digital converter 275 (ADC). The analog to digital converter 275 supplies the digitized pixel signals to an image processor 280 which forms a digital image.

Figure 2:
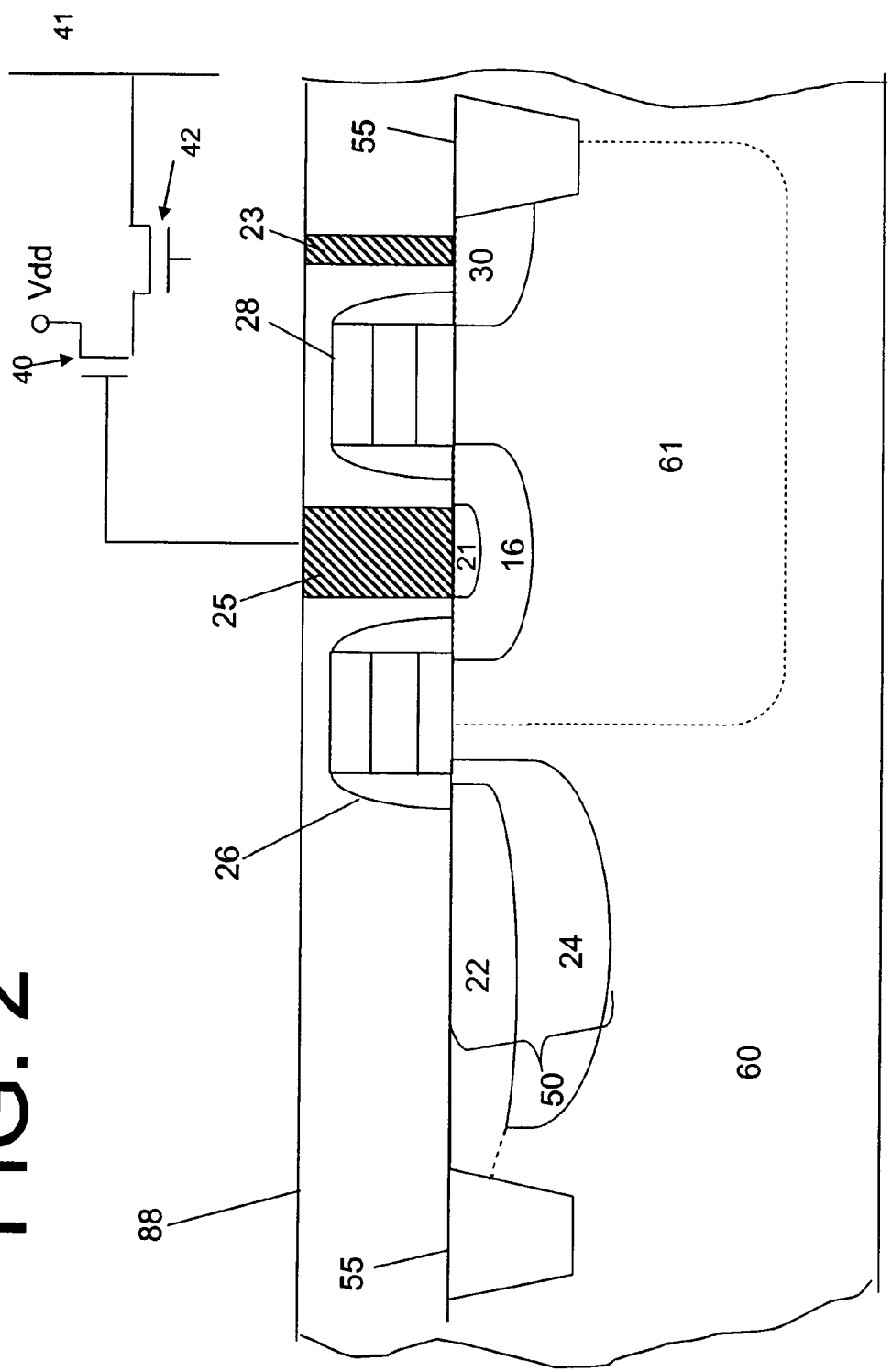
FIG. 2 is a cross-sectional view of an exemplary pixel sensor cell constructed according to an embodiment of the invention.

FIG. 2 illustrates a pixel sensor cell constructed in accordance with a first exemplary embodiment of the invention. A photoconversion device 50 is formed in a substrate 60 having a doped layer or well 61, which for exemplary purposes is a p-type well. The photoconversion device 50 is illustratively formed in a p-type substrate 60 which also has a more heavily doped p-type well 61. The photoconversion device 50 is illustratively a photodiode and may be a p-n junction photodiode, a Schottky photodiode, or any other suitable photoconversion device.

The exemplary p-n-p photodiode 50, as shown in FIG. 2, consists of a p+ region 22 and an n-type region 24, where only n-type region 24 is within substrate 60. The remaining structures shown in FIG. 2 include a transfer transistor with associated gate 26 and a reset transistor with associated gate 28. Floating diffusion region 16, source/drain region 30 and shallow trench isolation (STI) regions 55 are also shown. A source follower transistor 40 and row select transistor 42 with associated gates are also included in the pixel sensor cell but are not shown as cross-sections. They are instead depicted in electrical schematic form with the output of the row select transistor 42 being connected to a column line 41. Although shown in FIG. 2 as a four-transistor (4T) configuration with a transfer transistor, the invention can also be utilized in a three-transistor (3T) configuration, without a transfer transistor, and in pixels with other transistor number configurations, e.g., 2T, 5T, 6T, 7T, etc.

As is described below in more detail, a slot 17 (shown in FIG. 9) is created for the formation of contact 25 according to the invention, which is different from contact 23. An angled implant is conducted through slot 17 to form phosphorous plug 21 before contact 25 is formed. Although described below in reference to a phosphorous implant for a phosphorous plug, the method of the embodiment may be used for implantation and masking of any suitable material. As is also discussed below, the angled implant into slot 17 allows phosphorous or other suitable materials to be implanted into floating diffusion region 16 only and not into smaller, differently shaped contact holes etched into passivation layer 88. The targeted implantation of phosphorous or other suitable material prevents contamination into other parts of the pixel sensor cell and reduces the number of masking steps needed.

FIGS. 3–11 show one exemplary method of forming a pixel sensor cell according to the invention, such as the cell illustrated in FIG. 2, at various stages of formation. For convenience, the same cross-sectional view of FIG. 2 is utilized in FIGS. 3–11 for the ensuing description and the source follower and row select transistors are not illustrated.

Figure 3:
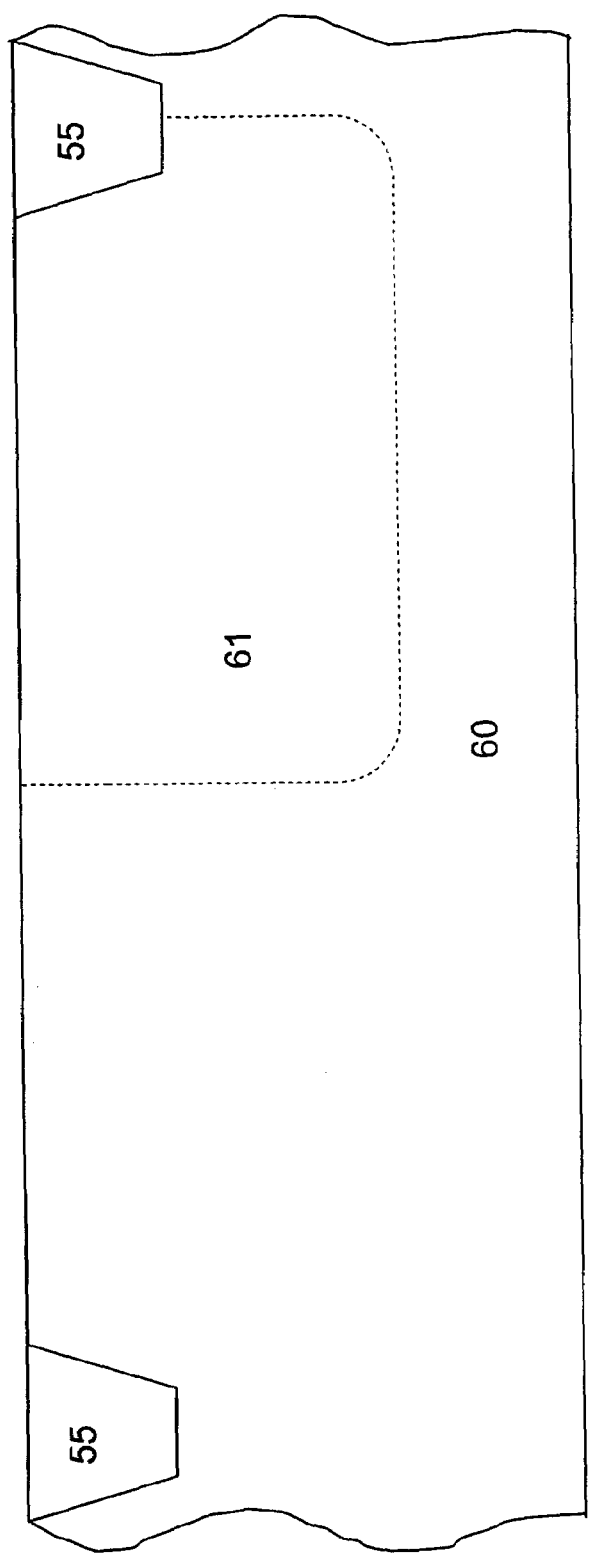
FIG. 3 shows a cross-sectional view of a portion of the FIG. 2 pixel during a stage of processing performed in accordance with an embodiment of the invention.

Referring to FIG. 3, a substrate 60, which is a p-type silicon substrate with a separate p-well 61 formed therein is provided. The p-type well 61 may be formed before or after the formation of isolation regions 55. The p-well implant may be conducted so that the pixel array well 61 and a p-type periphery logic well, which will contain logic circuits for controlling the pixel array, have different doping profiles. As known in the art, multiple high energy implants may be used to tailor the profile and position of the p-type well 61.

Isolation regions 55 are formed to electrically isolate regions of the substrate where pixel cells will later be formed. The isolation regions 55, can be formed by any known technique such as thermal oxidation of the underlying silicon in a LOCOS process, or by etching trenches and filling them with oxide in an STI (shallow trench isolation) process. Following formation of isolation regions 55 if the p-type well 61 has not yet been formed, it may then be formed by blanket implantation or by masked implantation to produce the p-type well 61.

Figure 4:
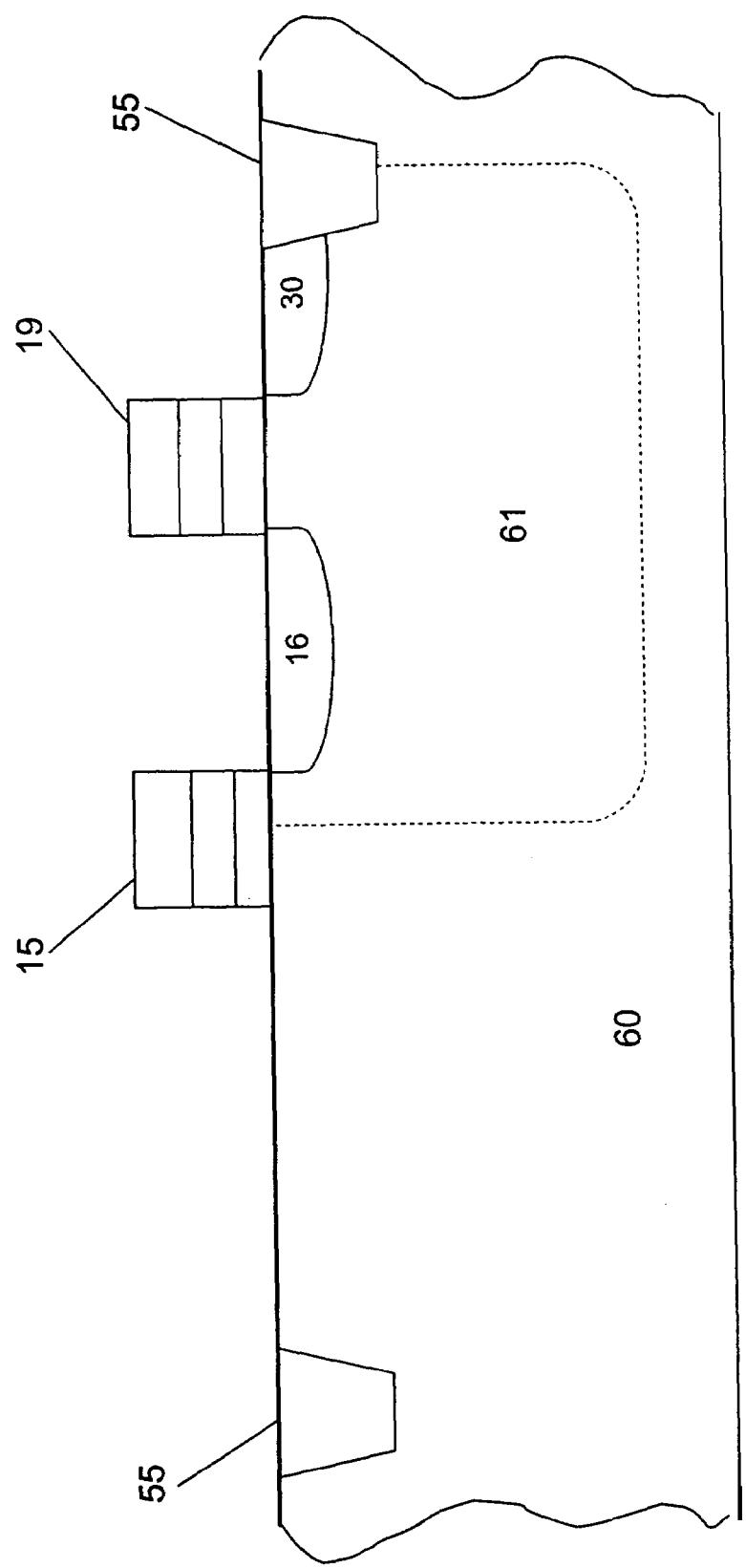
FIG. 4 shows a stage of processing subsequent to that shown in FIG. 3.

Referring to FIG. 4, a transfer gate stack 15 and reset gate stack 19 are formed by well-known methods, e.g., blanket deposition of gate oxide, doped polysilicon, deposition of metal for a silicide, deposition of nitride cap layer and annealing to form a silicide, patterning and etching. The invention is not limited to a particular method of forming transistor gate stacks 15, 19. Although shown in this embodiment as having a transfer transistor in a 4T configuration, the invention can also be used in a 3T configuration having a reset transistor, source follower transistor and row select transistor, without the transfer transistor gate stack 15 shown in FIG. 4. Source/drain region 30 and floating diffusion region 16 are also formed at this time, by methods known in the art. According to an embodiment of the invention, source/drain region 30 and floating diffusion region 16 are p+ type doped in order to form a p-channel within the substrate 60.

Figure 5:
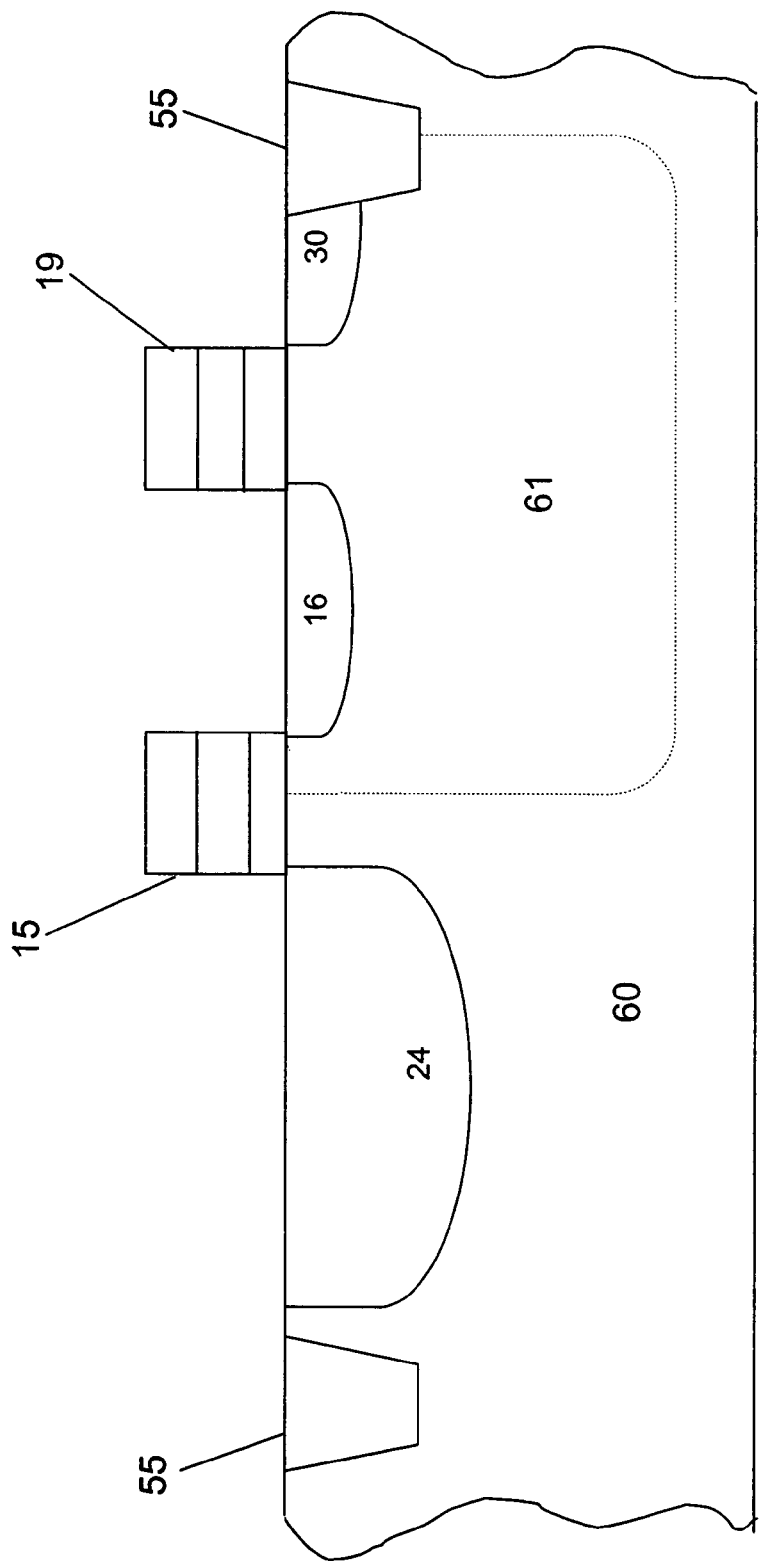
FIG. 5 shows a stage of processing subsequent to that shown in FIG. 4.
Figure 6:
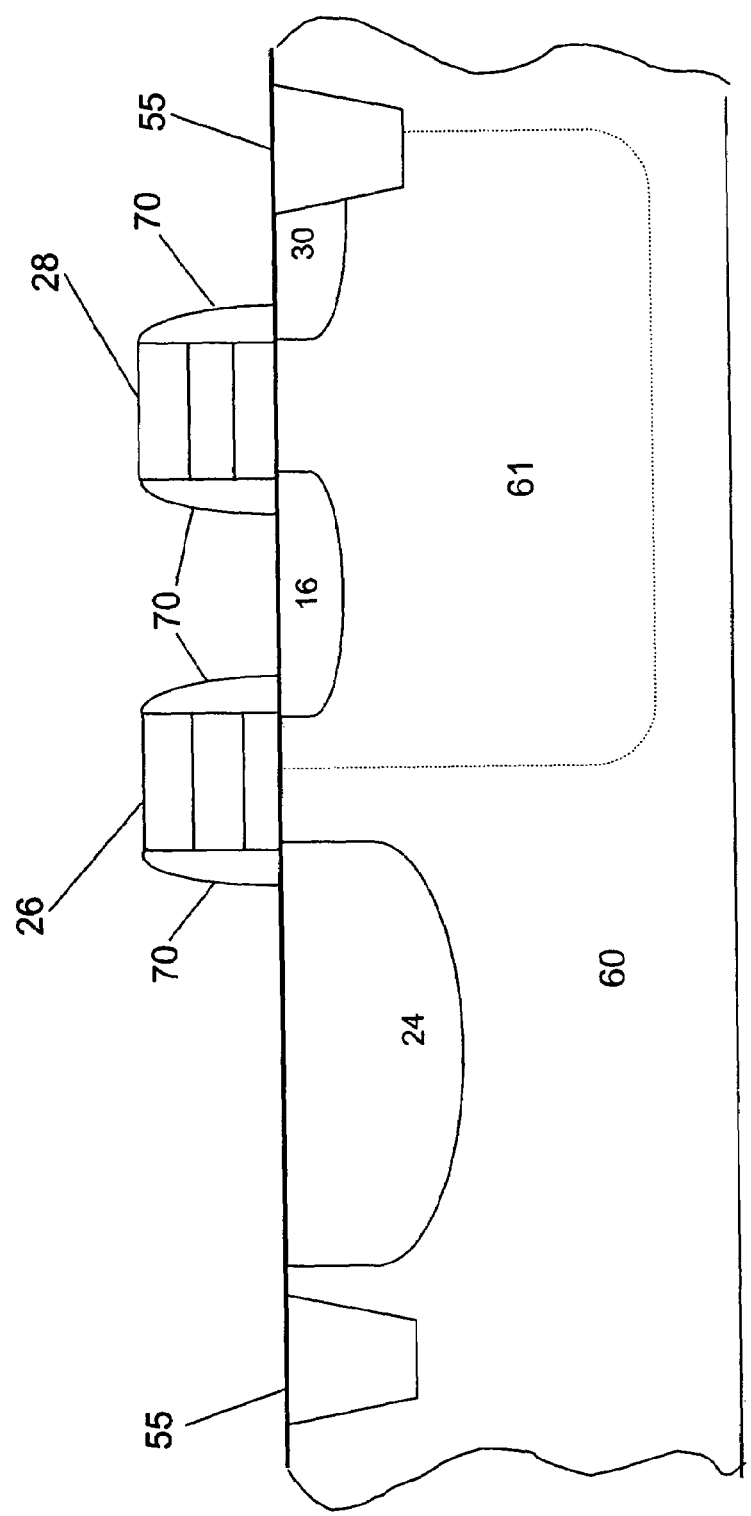
FIG. 6 shows a stage of processing subsequent to that shown in FIG. 5.
Figure 7:
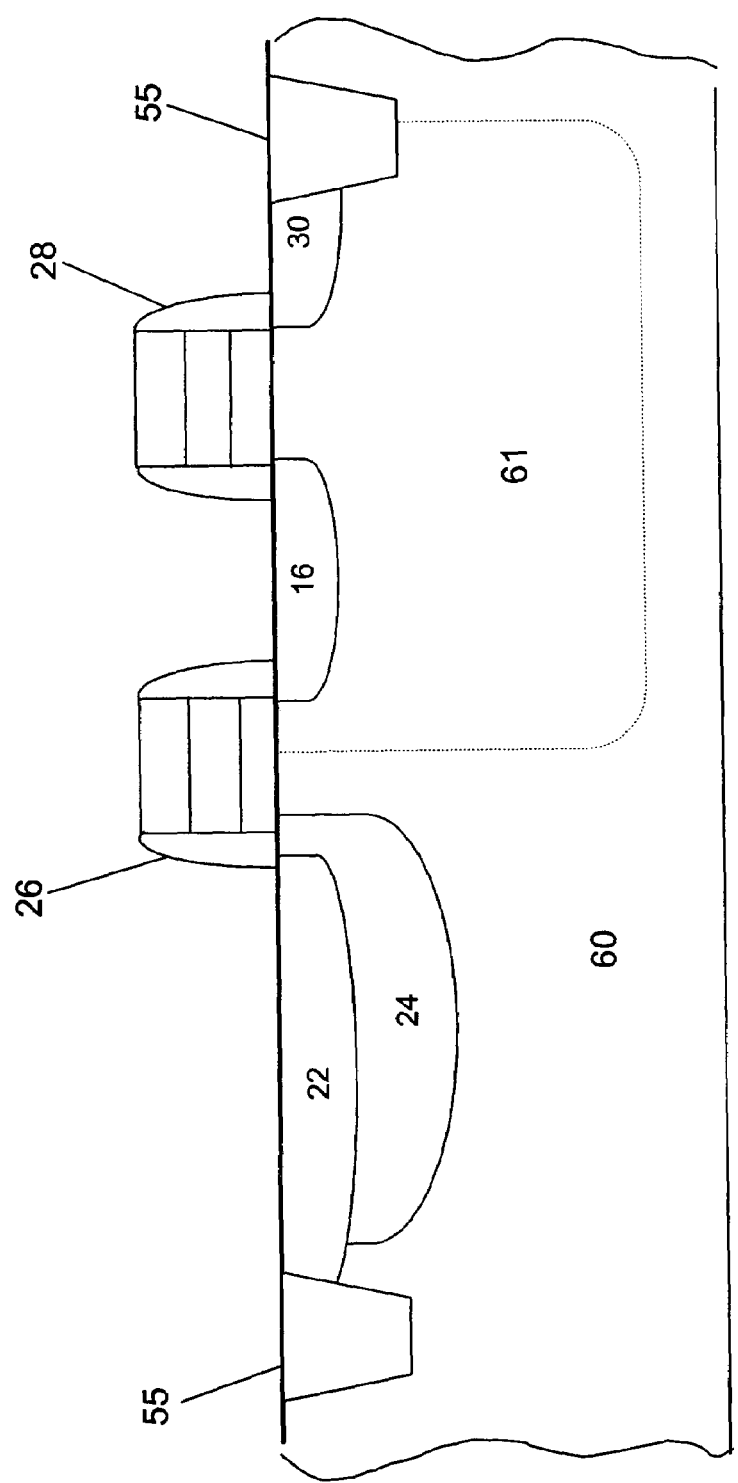
FIG. 7 shows a stage of processing subsequent to that shown in FIG. 6.

FIG. 5 illustrates a formed region 24 of photodiode 50 (FIG. 2). In this embodiment, region 24 is a p-type region. Region 24 is formed by methods known in the art, such as for example, ion implantation. As shown in FIG. 6, gate stack sidewall insulators 70 are formed on the sides of the gate stacks 15, 19 (FIG. 5), using conventional techniques, to form transfer and reset transistors with associated gates 26, 28. Gate stack sidewall insulators are also formed on other remaining gate stacks but are not shown in FIG. 6. Region 22 (FIG. 7) of the photodiode 50 may be formed at this time and for exemplary purposes, is an n-type region.

Figure 8:
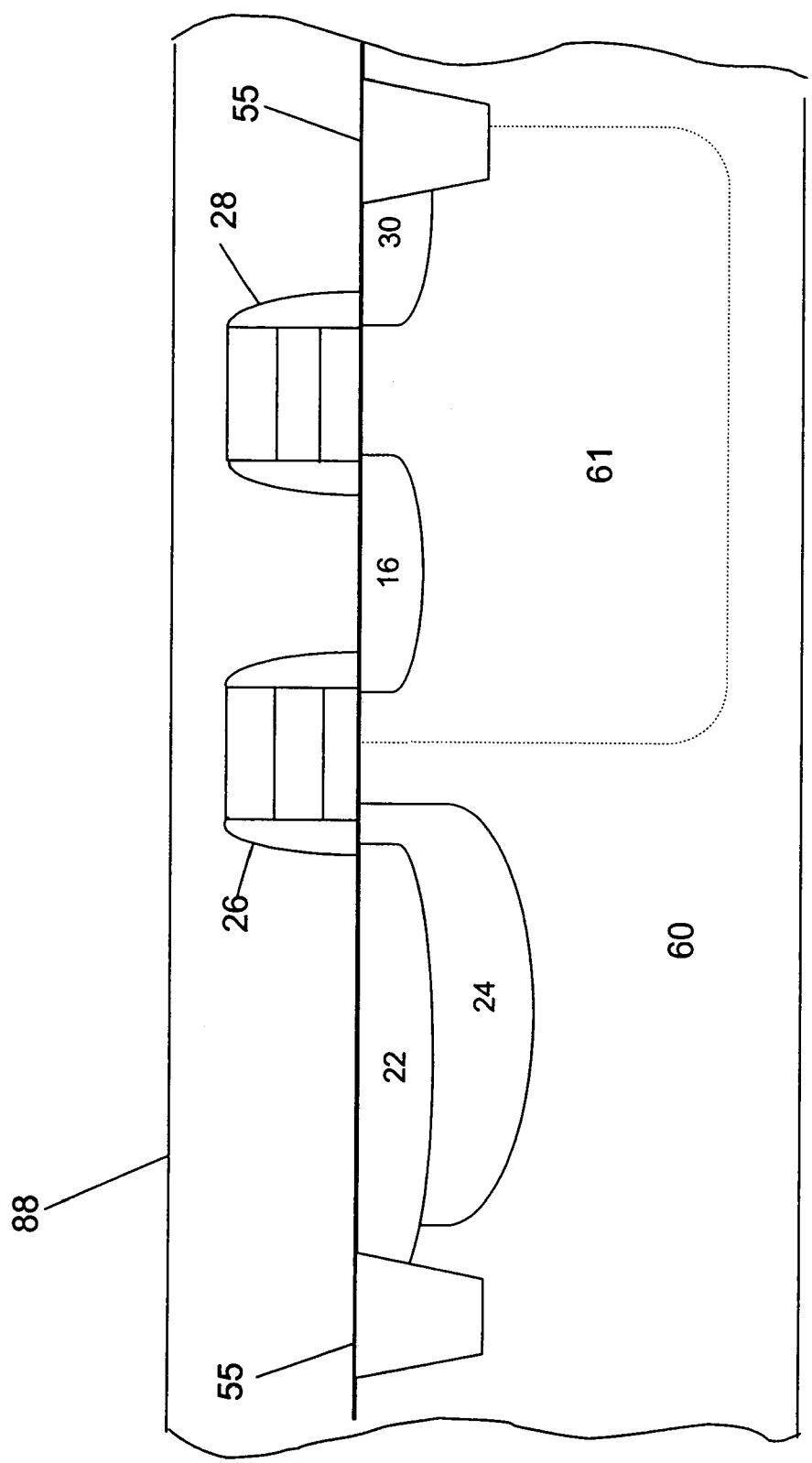
FIG. 8 shows a stage of processing subsequent to that shown in FIG. 7.
Figure 9:
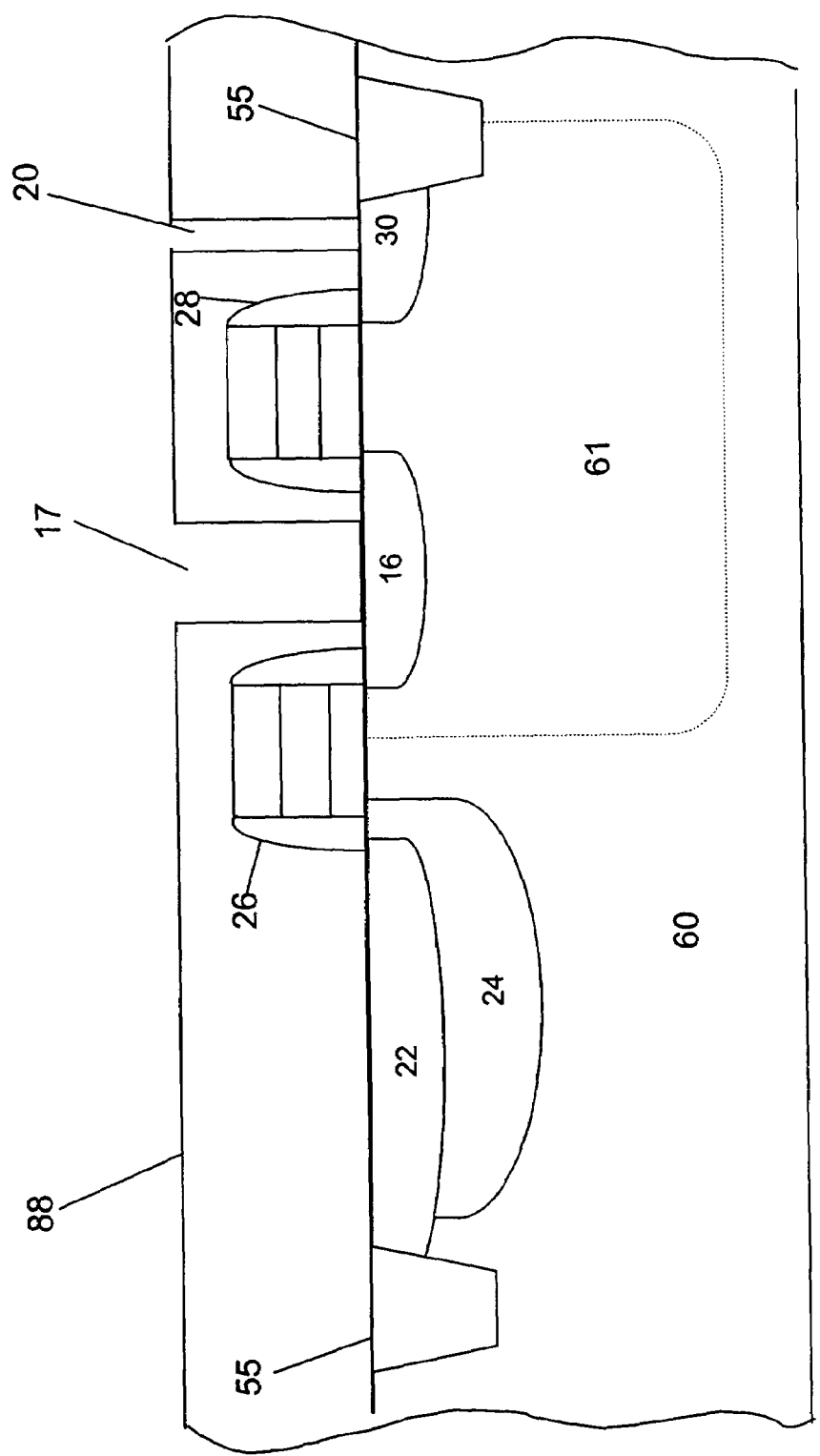
FIG. 9 shows a stage of processing subsequent to that shown in FIG. 8.

FIG. 8 shows a formed passivation layer 88 that could be formed of, for example, silicon dioxide, boro-silicate glass (BSG), phosphosilicate glass (PSG), or boro-phospho-silicate glass (BPSG). The passivation layer 88 is CMP planarized and etched to provide a slot 17 according to the invention (FIG. 9). Slot 17 has a footprint, on the top surface of the floating diffusion region 16, which is an oblong or elliptical shape (FIG. 11a) and is larger than footprints of the other contact holes (e.g., hole 20) formed in passivation layer 88.

FIG. 9 also shows a contact hole 20 etched in layer 88 to be used for a conventional contact. At this time, an implant 33 (FIG. 10) is performed at 35 KeV and an implant depth of about 300–400 Å. For exemplary purposes implant 33 is a phosphorous implant, however, any suitable material can be implanted at this stage. In this embodiment, implant 33 is performed at an angle of about 20° from a line perpendicular to the substrate 60 surface. However, the angle of implant 33 depends on the aspect ratio (depth:diameter) of the contact, which can range from about 10:1 to about 5:1. That is, the larger the aspect ratio, the smaller the angle can be (although it still must have an angle greater than 0°). Implant 33 goes through slot 17 into floating diffusion region 16. Because slot 17 is wider than the other contact holes, the angled implant of phosphorous results in phosphorous implantation only in the floating diffusion region 16 and not through the other contact holes (e.g., hole 20). Therefore, other areas of the pixel are not contaminated with phosphorous and an extra masking step (to cover other holes) is unnecessary. Also, although the slot 17 is shown over floating diffusion region 16, slot 17 may be formed over any other suitable area of the substrate where an implantation is desirable.

FIG. 11a shows a top view of a footprint of the slot 17 having an oblong shape according to an embodiment of the invention as compared to the footprint of the conventional contact hole 20. FIG. 11b shows an exemplary side view of slot 17 over floating diffusion region 16 and the contact hole 20 over source/drain region 30. It should be appreciated that contact hole 20 can also be positioned over other areas of the pixel cell. As can be seen from the side view, slot 17 exposes a larger surface area of the substrate surface than contact hole 20. According to the present embodiment, when phosphorous (or other material) is implanted at an angle of about 20° (shown in FIG. 11b as implant 33) the phosphorous will only be implanted into slot 17 and not implanted into contact hole 20 due to the angle of implantation. Although described in the current embodiment as a 20° angled implant, the angle of the implant will depend on the aspect ratio of slot 17 (the depth compared to the diameter). An aspect ratio of 10:1 would mask out most non-0° implants, while an aspect ratio of 5:1 would let larger angled implants to reach the bottom of slot 17. The angled implantation through slot 17 minimizes contamination of other contact holes and reduces processing steps because an additional masking step is not needed for the implantation.

FIG. 12 illustrates phosphorous plug 21, which was formed as described in relation to FIG. 10 with implant 33. FIG. 12 also shows contact 25 and contact 23 formed in slot 17 and contact hole 20, respectively. Contacts 25, 23 may be metallized contacts. Contact 25 is in contact with phosphorous plug 21. Phosphorous plug 21 reduces resistance in the pixel. Conventional layers of conductors and insulators may also be used to interconnect the structures and to connect the pixel to peripheral circuitry.

This embodiment may be used with any species of dopant and phosphorous is used for exemplary purposes only. The combination of the implant angle and contact size allows a single photo mask to perform the function of two masks. The embodiments of the invention allow a combination of, for example, an interconnect etch mask and desirable implant mask, with one mask being a subset of the other.

Figure 13:
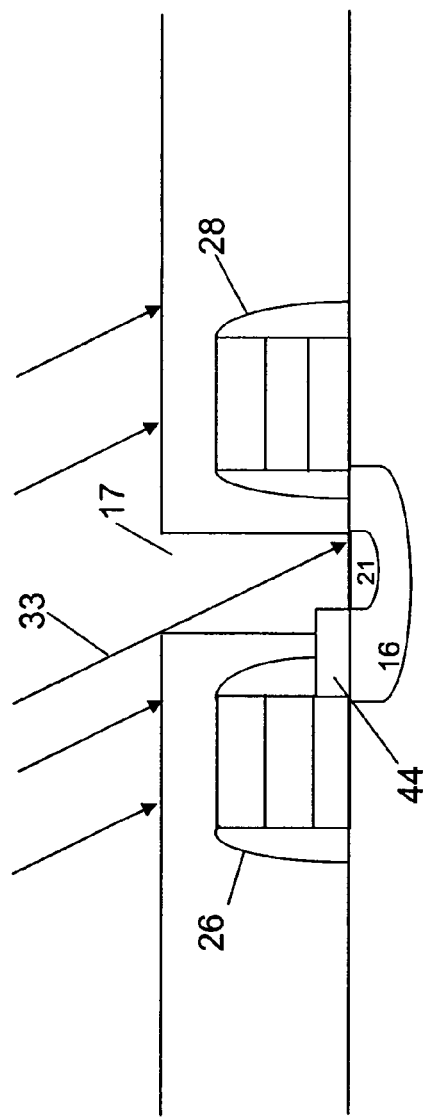
FIG. 13 shows a second embodiment of a pixel according to the invention.

FIG. 13 shows another embodiment of the invention where additional portions of a blocking material 44, for example polysilicon or Si$_3$N$_4$, extends from the gate 26 of the transfer transistor to narrow the opening of slot 17 over the floating diffusion region 16. Implant 33 is performed at an angle of about 20° from a line perpendicular to substrate 60, thereby forming exemplary phosphorous plug 21 in the floating diffusion region 16 without contaminating other areas of the pixel and minimizing the number of masking steps needed. However, the angle of implant 33 depends on the aspect ratio (depth:diameter) of the contact and can range from about 10:1 to about 5:1. Again, the extension of a blocking material from gate 26 of the transfer transistor reduces the footprint of slot 17, which may be preferable in certain applications to decrease leakage.

Figure 14:
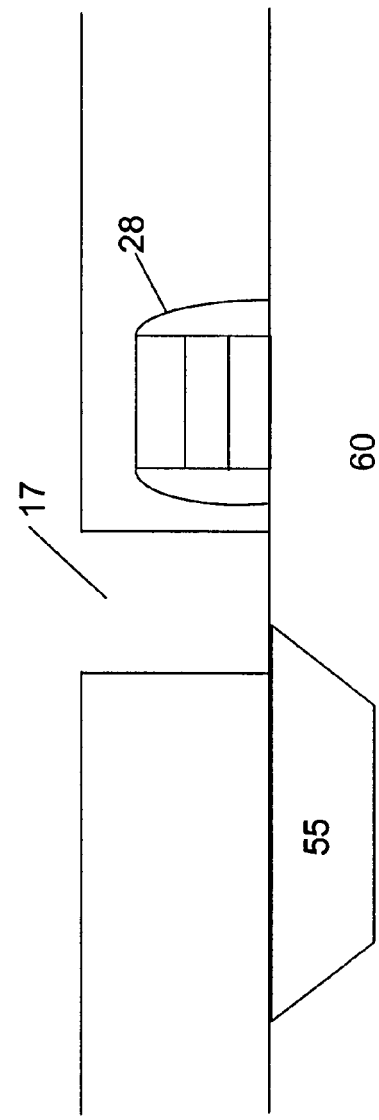
FIG. 14 shows a third embodiment of a pixel according to the invention.

Another embodiment is shown in FIG. 14 where an STI region 55 extends under slot 17. As described above, an implant 33 is performed at an angle of about 20° from a line perpendicular to substrate 60, which reduces contamination of other areas of the pixel and reduces masking steps. The angle of implant 33 depends on the aspect ratio (depth:diameter) of the contact and can range from 10:1 to 5:1. The extended portion of STI region 55 also reduces the footprint of a contact on the silicon substrate 60, which may be preferable in certain applications to decrease leakage.

Figure 15:
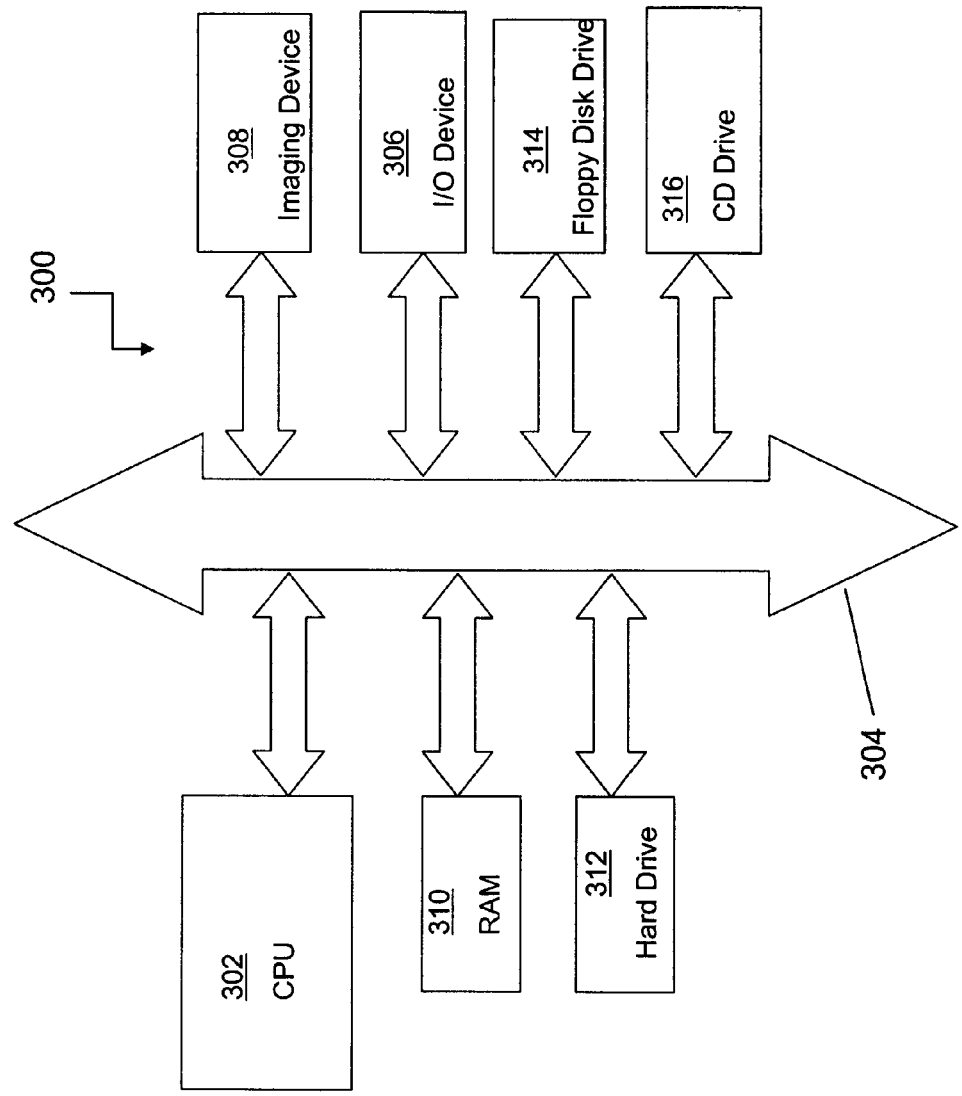
FIG. 15 is a diagram of a processor system employing an imager constructed in accordance with an embodiment of the present invention.

FIG. 15 shows a processor system 300, which includes an imager device 308 having the overall structure of FIG. 1, but having an array of pixels constructed in accordance with any of the embodiments of the invention. The imager device 308 may receive control or other data from system 300. System 300 includes a processor 302 having a central processing unit (CPU) that communicates with various devices over a bus 304. Some of the devices connected to the bus 304 provide communication into and out of the system 300; an input/output (I/O) device 306 and imager device 308 are such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 1 with the pixel array 200 having the characteristics of the invention as described above in connection with FIGS. 2–14. The imager device 308 may, in turn, be coupled to processor 302 for image processing, or other image handling operations.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A pixel sensor cell comprising:
   a first slot formed in a passivation layer over a charge collection region;
   a dopant implant region formed in said charge collection region underneath said first slot; and
   a first contact formed through said first slot, wherein said first contact has a footprint larger than a second contact formed in said pixel sensor cell.

2. The pixel sensor cell of claim 1, wherein said first slot has a footprint having an oblong shape.

3. The pixel sensor cell of claim 1, wherein said first slot has a footprint having an elliptical shape.

4. The pixel sensor cell of claim 1, wherein said charge collection region is a floating diffusion region.

5. The pixel sensor cell of claim 1, wherein said first slot is etched in an insulator layer.

6. The pixel sensor cell of claim 1, further comprising a layer of a blocking material, wherein said blocking material extends from an adjacent gate stack and thereby decreases a size of said footprint over said charge collection region.

7. An imaging device, comprising:
   an array of pixel sensor cells formed in a doped layer, wherein each pixel sensor cell comprises:
   a first slot formed in a passivation layer and over a charge collection region, a dopant implant region formed in said charge collection region underneath said first slot and a first contact formed through said first slot, wherein said first contact has a footprint larger than a second contact formed in said pixel sensor cell; and
   signal processing circuitry formed in a substrate and electrically connected to the array of said pixel sensor cells for receiving and processing signals representing an image output by the array of the said sensor cells and for providing output data representing said image.

8. The imaging device of claim 7, wherein said first slot has a footprint having an oblong shape.

9. The imaging device of claim 7, wherein said first slot has a footprint having an elliptical shape.

10. The imaging device of claim 7, wherein said charge collection region is a floating diffusion region.

11. The imaging device of claim 7, wherein said first slot is etched in an insulator layer.

12. The imaging device of claim 7, further comprising a layer of a blocking material, wherein said blocking material extends from an adjacent gate stack and thereby decreases a size of said footprint over said charge collection region.

13. A processing system comprising:
   a processor; and
   an imaging device coupled to said processor, said imaging device having at least one pixel sensor cell comprising:
   a first slot formed in a passivation layer of said pixel sensor cell and over a charge collection region, a dopant implant region formed in said charge collection region underneath said first slot and a first contact formed through said first slot, wherein said first contact has a footprint larger than a second contact formed in said pixel sensor cell; and
   a readout circuit comprising at least an output transistor formed on a substrate.

14. The system of claim 13, wherein said first slot has a footprint having an oblong shape.

15. The system of claim 13, wherein said first slot has a footprint having an elliptical shape.

16. The system of claim 13, wherein said first slot is etched in an insulator layer.

17. The system of claim 13, further comprising a layer of a blocking material, wherein said blocking material extends from an adjacent gate stack and thereby decreases a size of said footprint over said charge collection region.

18. The pixel sensor cell of claim 1, wherein said second contact is formed in a second slot in said passivation layer.

19. The pixel sensor cell of claim 7, wherein said dopant implant region is formed by angled implantation.

20. The processing system of claim 13, wherein said second contact is formed through a second slot, and said second slot is formed over another dopant implant region.

* * * * *